(12) United States Patent
Pandhumsoporn et al.

(10) Patent No.: US 6,287,437 B1
(45) Date of Patent: Sep. 11, 2001

(54) RECESSED BONDING OF TARGET FOR RF DIODE SPUTTERING

(75) Inventors: Tamarak Pandhumsoporn, Fremont; Mark Feldman, Castro Valley, both of CA (US)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/564,582

(22) Filed: May 5, 2000

(51) Int. Cl.[7] .................................................. C23C 14/34
(52) U.S. Cl. .............................. 204/298.13; 204/298.12; 427/314; 427/398.1
(58) Field of Search ........................ 204/192.12, 298.12, 204/298.13; 427/314, 398.1; 428/594

(56) References Cited

U.S. PATENT DOCUMENTS

| 4,209,375 | 6/1980 | Gates et al. ..................... 204/192 R |
| 4,272,355 | 6/1981 | Kennedy ............................... 204/298 |
| 4,341,816 | 7/1982 | Lauterbach et al. ................... 427/34 |
| 4,569,745 | 2/1986 | Nagashima ........................... 204/298 |
| 5,178,739 * | 1/1993 | Barnes et al. ................... 204/192.12 |
| 5,282,943 | 2/1994 | Lannutti et al. ................ 204/192.12 |
| 5,372,694 | 12/1994 | Szcyrbowski .................... 204/298.12 |
| 5,403,458 | 4/1995 | Hartig et al. ..................... 204/192.15 |
| 5,693,203 | 12/1997 | Ohhashi et al. ................. 204/298.12 |
| 5,857,611 | 1/1999 | Gilman et al. ....................... 228/193 |
| 5,922,176 | 7/1999 | Caskey ............................ 204/192.12 |

FOREIGN PATENT DOCUMENTS

| 6-65728 * | 3/1994 | (JP) ................................. C23C/14/34 |
| 6-240450 * | 8/1994 | (JP) ................................. C23C/14/34 |

* cited by examiner

*Primary Examiner*—Nam Nguyen
*Assistant Examiner*—Steven H VerSteeg
(74) *Attorney, Agent, or Firm*—Sughrue, Mion, Zinn, Macpeak & Seas, PLLC

(57) ABSTRACT

A recessed sputtering target assembly is provided with a bonding material disposed between a dielectric target and a backing plate. The bond line of the bonding material is recessed away from the edges of the target and backing plate, preferably by ¼ inch. The sputtering target assembly may be used during high RF power processes to achieve high deposition rates without arcing of the bonding material or contamination of the sputtering chamber.

9 Claims, 3 Drawing Sheets

RECESSED BONDING OF TARGET FOR RF DIODE SPUTTERING

BACKGROUND OF THE INVENTION

1. Field of the Invention

The present invention relates generally to sputtering targets, and more particularly to an improved sputtering target assembly and method for making and using an improved sputtering target assembly. The sputtering target is used for dielectric bonding and semi-dielectric bonding in high radio frequency (RF) diode sputtering. The present invention provides an improved sputtering target assembly that reduces arcing in an RF diode sputtering chamber and reduces contamination of a film being produced. The method and apparatus of the present invention can be implemented in manufacturing of thin film head devices for inductive heads, magnetoresistance (MR), giant magnetoresistance (GMR), spin valve and tunneling magnetoresistance (TMR) devices. It can also be used for semiconductor IC fabrication, as well as microelectromechanical systems (MEMS), optical coatings, microelectronics, and other applications.

2. Description of the Related Art

Sputtering involves the deposition of a thin film of a desired material on a substrate. The material to be deposited on the substrate is removed from a sputtering target. The sputtering target and the substrate are disposed in a sputtering chamber, and heat is applied to the chamber. Generally, the material is removed from the target because it is bombarded with ions that are generated when an RF or DC voltage is applied to the target, and the material is thus transferred to the substrate.

A conventional sputtering target assembly 10 is illustrated in FIG. 1. A dielectric target 11 is mounted to a backing plate 12 with a bonding material 13 therebetween. The backing plate 12 removes heat which has been transferred to the target 11 during the bombardment of the ions. Thus, there must be good thermal and structural bonding between the backing plate and target to ensure adequate heat transfer from the target to the backing plate.

Copper backing plates are commonly used in DC, DC magnetron or RF diode sputtering for metal and dielectric films. The bonding material between the target and backing plate may consist of indium with some small amounts of other metals, such as silver, gold or lead. As shown in FIG. 1, the bonding material 13 is disposed between the target 11 and the backing plate 12 so that a bond line 13a reaches the edge of the assembly. In other words, the bond line 13a refers to the outside edge of the bonding material. In conventional assemblies, the bonding material completely covers the area between the target material and the backing plate.

This sputtering target assembly 10 is applied to metal and dielectric targets. Preferred fields of application include thin film head technology, where high RF power is used for dielectric sputtering as required for high throughput. Additional applications include semiconductor ICs, MEMS, optical coatings and microelectronics.

The typical backing plate which is made of copper, or other material such as aluminum, is water cooled. In FIG. 1, the backing plate 12 is constructed from copper with plated nickel. Cooling liquid is circulated in heat transfer contact with the backing plate to remove heat transferred to the target by the ions. In particular, the internal structure of the backing plate has water cooling channels (not shown) with inlets and outlets for the water. The water circulates through these channels to remove the heat that has been generated in the target. The backing plate can be any shape, such as round, square or rectangular.

With the conventional sputter target assembly, problems occur when high RF power is applied to the target. Specifically, the bonding material, i.e. indium, is a low temperature material and its atoms can easily escape in a high electric field (high power) and high temperature environment. This causes arcing and spitting of the indium into the sputtering chamber. As a result, the sputtering chamber and substrate are contaminated with the bonding material. The contamination of the substrate leads to a loss of integrity of the substrate.

In addition, the conventional sputtering target assembly has voids in the bonding material 13 between the backing plate 12 and target 11. Conventional bonding techniques cannot eliminate such voids which are created during the target bonding.

Voids can crack the target and cause over-heating in those areas, i.e., hot spots. This type of phenomenon is very undesirable during deposition. The voids occurring in the center area of the bonding area, i.e., the inner portion of the area between the target and backing plate, are generally acceptable unless they are large voids. These interior voids are generally acceptable because the adjacent areas tend to dissipate the heat.

On the other hand, voids located near the edge of the target assembly are problematic due to the lack of adjacent areas to dissipate the heat. Voids occurring near the edges of backing plate and target cause over-heating in that area and the bonding material to melt and spit out into the chamber. This causes the plasma to be unstable and the system to shut down.

Additional problems with conventional sputter target assemblies include film pitting and other contamination during the arcing when the bonding material (indium) is deposited on the film.

In view of these problems, it is desirable to make the plasma stable by reducing the arcing which is caused by the bonding material (indium) spitting out from the bond line between the target and backing plate. The present inventors' sputtering target assembly prevents the bonding material from spitting out, reduces over-heating on hot spots, and minimizes arcing during the sputtering process.

SUMMARY OF THE INVENTION

The objective of the present invention is to reduce arcing of a bonding material in a sputtering target assembly and to reduce contamination of a sputtering chamber and substrate. This objective is accomplished by providing an improved sputtering target assembly and method of making and using the same. The target bonding technique of the present invention includes applying a substantially oxide-free indium bonding material between a target and a backing plate so that the bond line is recessed from the edges of the target and bonding plate.

The present invention provides a sputtering target assembly comprising: a dielectric target; a metal coating layered on one face of the dielectric target; a layer of bonding material disposed on the metal coating layer; and a backing plate disposed on said dielectric target, so that the layer of bonding material is disposed between the metal coating layer and the backing plate, wherein a bond line of the bonding material is recessed away from peripheral edges of the target and backing plate.

The bond line of the bonding material is preferably recessed about ¼ inch away from the edges of the target. The recessed structure reduces the arcing and spitting of the bonding material, thus improving the sputtering process and quality of the substrate product.

BRIEF DESCRIPTION OF THE DRAWINGS

The invention is described in detail below in conjunction with the attached drawings in which.

DETAILED DESCRIPTION OF THE INVENTION

Figure 1:
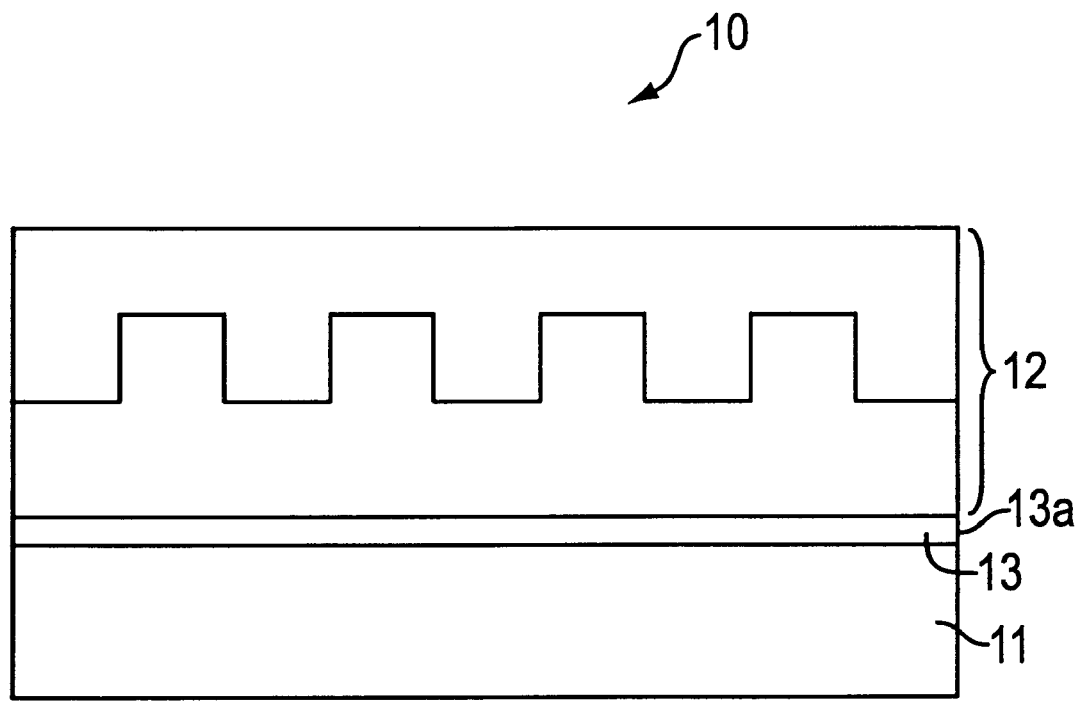
FIG. 1 is a schematic view of a conventional sputtering target assembly having a backing plate and a dielectric target.
Figure 2:
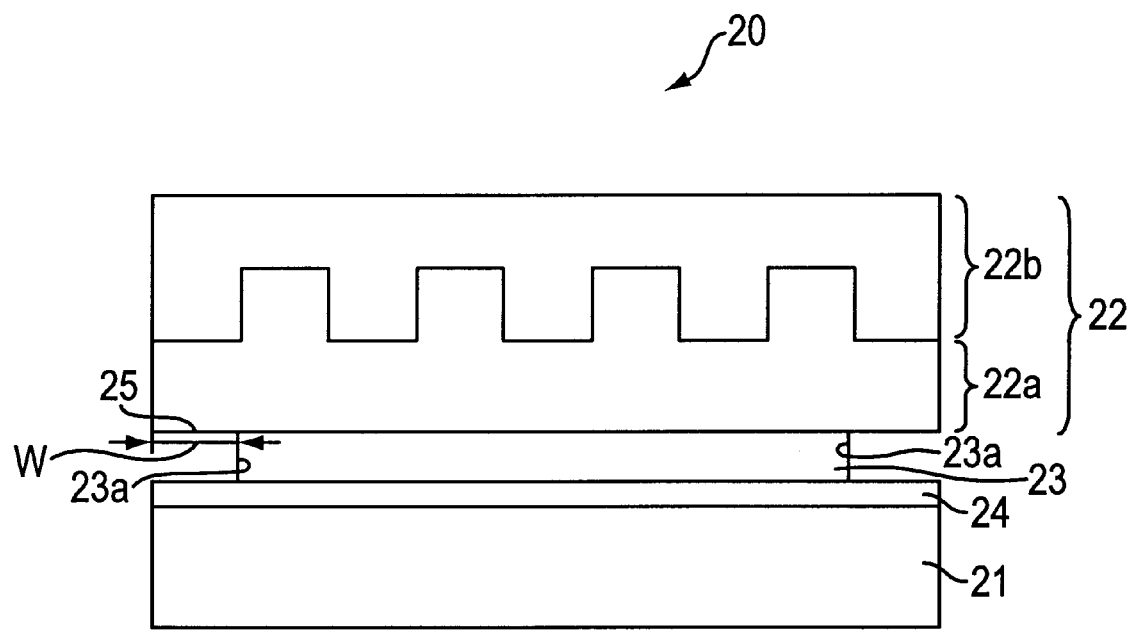
FIG. 2 shows an embodiment of the present invention having a recessed target bonding design with a copper/nickel plated backing plate and dielectric target.

The present invention will now be described with reference to the drawings. Referring to FIG. 2, a sputtering target assembly 20 according to the present invention is shown. A dielectric target 21, having a metal coating 24, is bonded to a backing plate 22, constructed of copper 22a and plated nickel 22b, with a bonding material 23. The dielectric target 21 may be formed of alumina. The bonding material 23 between the dielectric target 21 and the backing plate 22 may be formed of indium. The bonding material generally has impurities, such as gold, silver, tin or lead. Additionally, the present invention should not be construed as limited to indium for the bonding material, since other suitable materials may be used instead of, or in combination with, indium.

The bonding material 23 is recessed from the edges of the target 21, so that an area along the periphery of the target is not covered with the bonding material 23. In other words, a bond line 23a of the bonding material 23 is recessed from the edges of the backing plate 22 and target 21. Preferably, the bond line 23a is recessed about ¼ inches. Specifically, as shown in FIG. 2, a width W of a non-bonded area should be about ¼ inches. The thickness of the bonding layer is about 0.005 to 0.015 inches.

A side of the dielectric target 21 is coated entirely with metal 24. The metal layer 24 has a thickness of approximately 100 microns. The metal should be highly conductive and can be copper, nickel, aluminum, titanium, palladium, etc.

With the above structure, the bonding material does not spit out because the bonding material is distanced away from the edges of the target. If there is some arcing condition present at the edges of the target, there is no bonding material present to react in that area. Thus, contamination in the chamber is reduced. The ¼" recommended non-bonded area provides enough distance between the bonding material and the edge of the target to provide this advantage.

The method for making the sputtering target assembly will now be described.

The backing plate 22 is cleaned to remove all contaminants. Once the backing plate 22 is free of debris, it is heated to a temperature of at least 180° C. In this example, indium is used as the bonding material. Liquid indium is applied to the face of the backing plate 22 which will be adhered to the target 21. The liquid indium is applied to the entire face except for an edge area around the periphery of the face of the backing plate, i.e., the non-bonding area 25. In other words, if the backing plate has a circular shape with a diameter D, the indium is applied in a circular shape with a diameter d that is less than D, so that the outer edge of the backing plate does not have the indium applied thereto.

Preferably, the width of the outer edge is ¼ inch. Thus, in the above example, the diameter d of the bonding layer is ½ inch less than the diameter D of the backing plate. With this structure, the bond line 23a of the bonding layer 23 is recessed from the edge of the backing plate by the width W.

The liquid indium can be prevented from being applied on the outer edge of the backing plate (i.e., non-bond area 25) using some sort of barrier in different ways. For example, the recessed bond line 23a can be obtained by applying a high temperature, water-soluble tape to the backing plate 22 over the desired non-bonded area. Alternatively, an indium wire or indium metal sheet can be used as a guide to recess the bond line. The wire or sheet is slightly thicker than the bonding material thickness, thus acting as a wall to prevent the initial bonding material from flowing in the desired non-bonded area. Alternatively, a very shallow groove can be fabricated in the target backing plate. The groove can be located at the desired bond line location to prevent the bonding material from flowing into the non-bonded area. With each of these examples, the bonding material is prevented from being applied to the outer edge of the face of the backing plate, therefore, obtaining a recessed bond line.

Next, the target 21 is coated with the thin layer of metal 24, preferably a highly conductive metal, on the face of the target which will be bonded to the backing plate.

The target 21 is then placed on the backing plate 22. The target 21 and backing plate 22 are pressed together with a small force and thereby bonded together by the bonding layer 23.

The target assembly is then cooled down to room temperature in a dry environment. Once the bonding material has solidified, any unwanted bonding material can be removed. If desired, the tape can be removed. Also, the wire or sheet guide can be left in the target assembly structure after manufacturing. Specifically, if the wire or sheet guide are made of the same material as the bonding material, i.e., indium, the guide is simply embedded in the sputtering target structure and becomes a part of the bonding structure.

The bonding application can be conducted at atmospheric pressure or under a vacuum.

Moreover, although the above example uses a circular shaped assembly, the target and backing plate may have a rectangular shape, etc.

Figure 3:
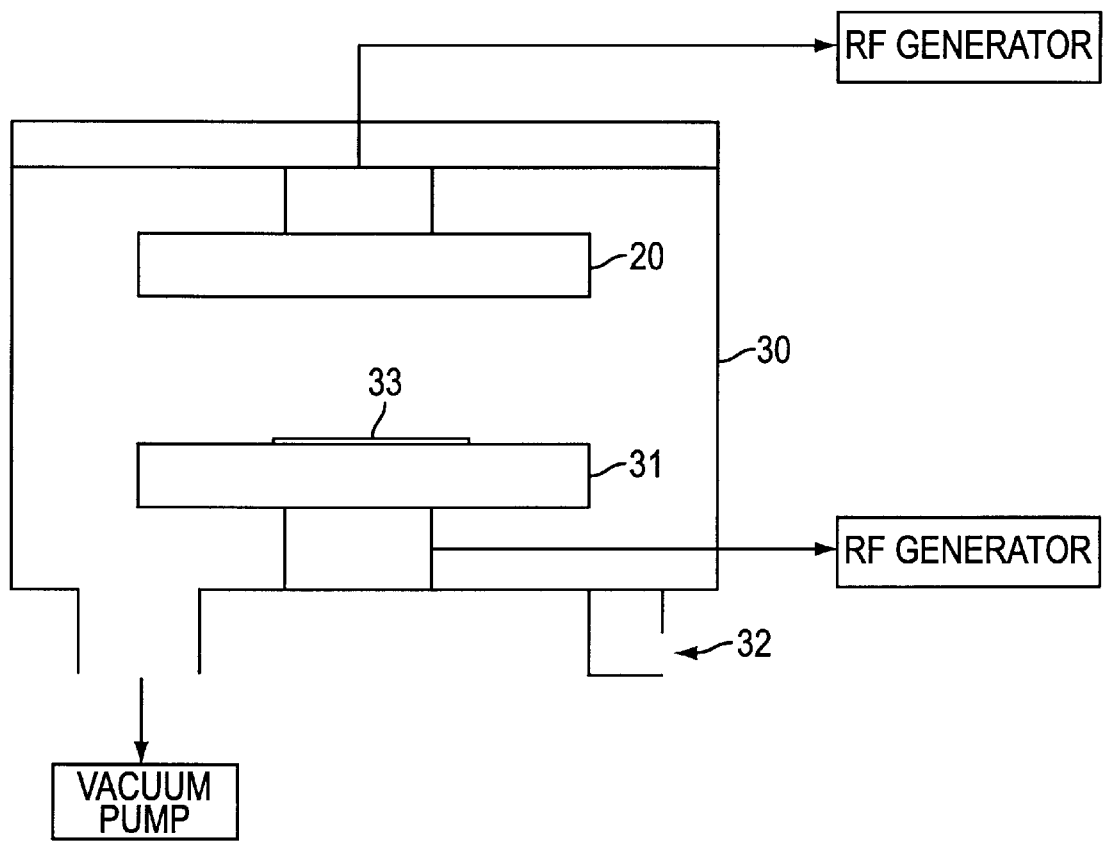
FIG. 3 shows a sputtering chamber having the recessed target assembly.

As shown in FIG. 3, a sputtering apparatus includes the sputtering target assembly 20 placed inside of a sputtering chamber 30 under vacuum. An RF generator (13.56 MHz) (not shown) is connected to the topside of the target assembly 20. The chamber 20 is evacuated to a desirable low pressure by a vacuum pump to remove undesirable impurities such as water vapor and atmospheric air. The ultimate chamber base pressure is less than $3 \times 10^{-7}$ torr. The operating base pressure is 20 mtorr.

Argon gas is injected into the chamber through inlet 32 to a desirable pressure to provide the necessary background environment for sputter deposition. Plasma is generated by the argon gas with the RF power generator providing power to the target.

A substrate 33 is placed on a substrate holder 31. The substrate 33 is also biased with an RF power generator (13.56 MHz) (not shown). A phase shifter (not shown) is used for regulating the phase between the two RF generators. Thereafter, the RF sputtering process takes place and a dielectric (alumina film) is deposited on the wafer.

Since the bonding material is recessed away from the edges of the target, arcing and spitting are reduced because less bonding material diffuses out from the edge of the target. In other words, excess or residual bonding material is reduced along the periphery of the target, thus reducing the amount of bonding material that melts, or spits out of the target assembly.

As discussed above, with the present invention, the bond line of the adhesive bonding material is recessed away from the periphery of the target and chamber walls. Thus, arcing is reduced. In addition, the present invention reduces contamination of the film being produced, prevents contamination to the chamber, and maintains the integrity of the bonding material and the substrate.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A sputtering target assembly, comprising:
    a dielectric target;
    a metal coating layered on a face of said dielectric target;
    a layer of bonding material disposed on the metal coating layer; and
    a backing plate disposed on said dielectric target, so that said layer of bonding material is disposed between said metal coating layer and said backing plate, an outer peripheral edge of said layer of bonding material defining an outer bond line,
    wherein said bond line of said layer of bonding material is recessed away from peripheral edges of said target and backing plate,
    wherein said layer of bonding material contains indium, and
    wherein said dielectric target is alumina, said backing plate includes copper and nickel, and said metal coating layer is aluminum.

2. The sputtering target assembly of claim 1, wherein said bond line of said layer of bonding material is recessed from the peripheral edges of the target and backing plate by about 0.25 inches.

3. A method of manufacturing a sputtering target assembly, comprising the steps of:
    coating a face of a dielectric target with metal;
    applying a bonding material to one face of a backing plate so that the bonding material has a bond line recessed from edges of the backing plate, wherein an outer peripheral edge of said bonding material defines the bond line;
    adhering the target to the backing plate so that the bonding material is disposed between the metal coating and the backing plate and the bond line is recessed away from edges of the target and the edges of the backing plate; and
    cooling the dielectric target and backing plate in a dry environment area,
    wherein the backing plate is heated to at least 180° C. before the step of applying the bonding material.

4. The method of manufacturing a sputtering target according to claim 3, wherein the bonding material is indium.

5. The method of manufacturing a sputtering target according to claim 3, wherein the step of applying the bonding material includes recessing the bond line from the edges of the dielectric target by about ¼ inches and forming the bonding layer to be about 0.0005 to 0.015 inches thick.

6. The method of manufacturing a sputtering target according to claim 3, wherein the coating step includes coating the metal layer to have a thickness of approximately 100 microns.

7. The method of manufacturing a sputtering target according to claim 3, wherein the metal layer is one of copper, nickel, aluminum, titanium and palladium.

8. A method of manufacturing a sputtering target assembly, comprising the steps of:
    coating a face of a dielectric target with metal;
    applying a bonding material to one face of a backing plate so that the bonding material has a bond line recessed from edges of the backing plate, wherein an outer peripheral edge of said bonding material defines the bond line;
    adhering the target to the backing plate so that the bonding material is disposed between the metal coating and the backing plate and the bond line is recessed away from edges of the target and the edges of the backing plate; and
    cooling the dielectric target and backing plate in a dry environment area,
    wherein a guide is provided to prevent the bonding material from being applied to a peripheral edge of the backing plate, so that the bonding material is only applied to an interior portion of the backing plate face.

9. A method of manufacturing a sputtering target assembly, comprising the steps of:
    coating a face of a dielectric target with metal;
    applying a bonding material to one face of a backing plate so that the bonding material has a bond line recessed from edges of the backing plate, wherein an outer peripheral edge of said bonding material defines the bond line;
    adhering the target to the backing plate so that the bonding material is disposed between the metal coating and the backing plate and the bond line is recessed away from edges of the target and the edges of the backing plate; and
    cooling the dielectric target and backing plate in a dry environment area,
    wherein a groove is provided on the backing plate face to prevent the bonding material from flowing on a peripheral portion of the backing plate, so that the bonding material is only applied to an interior portion of the backing plate face.

* * * * *